(12) United States Patent
Nagai et al.

(10) Patent No.: US 10,163,699 B2
(45) Date of Patent: Dec. 25, 2018

(54) CU WIRING FORMING METHOD AND SEMICONDUCTOR DEVICE MANUFACTURING METHOD

(71) Applicant: Tokyo Electron Limited, Tokyo (JP)

(72) Inventors: Hiroyuki Nagai, Nirasaki (JP); Peng Chang, Miyagi (JP); Kenji Matsumoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/553,608

(22) PCT Filed: Jan. 7, 2016

(86) PCT No.: PCT/JP2016/050305
§ 371 (c)(1),
(2) Date: Aug. 25, 2017

(87) PCT Pub. No.: WO2016/136287
PCT Pub. Date: Sep. 1, 2016

(65) Prior Publication Data
US 2018/0047624 A1    Feb. 15, 2018

(30) Foreign Application Priority Data
Feb. 26, 2015   (JP) .................................. 2015-036895

(51) Int. Cl.
*H01L 21/768*   (2006.01)
*H01L 21/28*    (2006.01)
(Continued)

(52) U.S. Cl.
CPC ...... *H01L 21/76882* (2013.01); *C23C 14/025* (2013.01); *C23C 14/046* (2013.01);
(Continued)

(58) Field of Classification Search
CPC ........ H01L 21/02266; H01L 21/203–21/2036; H01L 21/28061; H01L 21/28194;
(Continued)

(56) References Cited

U.S. PATENT DOCUMENTS

| 2012/0196052 A1* | 8/2012 | Ishizaka ............... C23C 14/025 |
| | | 427/576 |
| 2013/0214414 A1* | 8/2013 | Edelstein .......... H01L 21/76841 |
| | | 257/751 |
| 2014/0287577 A1* | 9/2014 | Emesh ............. H01L 21/76879 |
| | | 438/618 |

FOREIGN PATENT DOCUMENTS

| JP | 2001-516146 A | 9/2001 |
| JP | 2006-148075 A | 6/2006 |

(Continued)

OTHER PUBLICATIONS

International Search Report for PCT/JP2016/050305 dated Mar. 29, 2016.

*Primary Examiner* — Selim Ahmed
*Assistant Examiner* — Evan Clinton
(74) *Attorney, Agent, or Firm* — Pearne & Gordon LLP (57) ABSTRACT

A method of forming, on a substrate having on a surface thereof a film having a trench of a preset pattern and a via at a bottom of the trench, a Cu wiring by burying Cu or Cu alloy in the trench and the via includes forming a barrier film (process 2); forming, on a surface of the barrier film, a wetting target layer of Ru or the like (process 3); forming, on a surface of the wetting target layer, a Cu-based seed film by PVD (process 4); filling the via by heating the substrate and flowing the Cu-based seed film into the via (process 5); and forming, on the substrate surface, a Cu-based film made of the Cu or Cu alloy by PVD under a condition where the (Continued)

Cu-based film is flown on the wetting target layer to bury the Cu-based film in the trench (process 6).

16 Claims, 7 Drawing Sheets

(51) Int. Cl.
| | |
|---|---|
| *H01L 21/3205* | (2006.01) |
| *C23C 14/34* | (2006.01) |
| *C23C 14/58* | (2006.01) |
| *C23C 16/06* | (2006.01) |
| *C23C 16/56* | (2006.01) |
| *H01L 23/528* | (2006.01) |
| *C23C 14/02* | (2006.01) |
| *C23C 14/04* | (2006.01) |
| *C23C 14/16* | (2006.01) |
| *C23C 16/04* | (2006.01) |
| *H01L 23/532* | (2006.01) |

(52) U.S. Cl.
CPC ............ *C23C 14/165* (2013.01); *C23C 14/34* (2013.01); *C23C 14/5806* (2013.01); *C23C 16/045* (2013.01); *C23C 16/06* (2013.01); *C23C 16/56* (2013.01); *H01L 21/28* (2013.01); *H01L 21/3205* (2013.01); *H01L 21/768* (2013.01); *H01L 21/76843* (2013.01); *H01L 21/76853* (2013.01); *H01L 21/76876* (2013.01); *H01L 21/76883* (2013.01); *H01L 23/5283* (2013.01); *H01L 23/532* (2013.01); *H01L 23/53238* (2013.01); *H01L 23/53228* (2013.01)

(58) Field of Classification Search
CPC ........... H01L 21/2855; H01L 21/76858; H01L 21/76843; H01L 23/53238; H01L 21/76883; H01L 21/76882; H01L 21/3205; C23C 14/34–14/46; C23C 14/025; C23C 14/5806
See application file for complete search history.

(56) References Cited

FOREIGN PATENT DOCUMENTS

| | | |
|---|---|---|
| JP | 2009-105289 A | 5/2009 |
| JP | 2010-021447 A | 1/2010 |
| JP | 2012-169590 A | 9/2012 |
| JP | 2012-216765 A | 11/2012 |
| WO | 1999/009593 A1 | 2/1999 |

* cited by examiner

CU WIRING FORMING METHOD AND SEMICONDUCTOR DEVICE MANUFACTURING METHOD

CROSS-REFERENCE TO RELATED APPLICATION

This Application is a U.S. national phase application under 35 U.S.C. § 371 of PCT Application No. PCT/JP2016/050305 filed on Jan. 7, 2016, which claims the benefit of Japanese Patent Application No. 2015-036895 filed on Feb. 26, 2015, the entire disclosures of which are incorporated herein by reference.

TECHNICAL FIELD

The various embodiments described herein pertain generally to a Cu wiring forming method and a semiconductor device manufacturing method of forming a Cu wiring by burying Cu or Cu alloy in a trench and a via formed in a substrate.

BACKGROUND ART

In the manufacture of a semiconductor device, a required device is produced by repeating various processings such as a film forming processing or an etching processing on a semiconductor wafer (hereinafter, simply referred to as "wafer"). To meet a recent demand for high speed and high integration of the semiconductor device and miniaturization of a wiring pattern thereof, it is required to reduce resistance (improve conductivity) of a wiring and improve electromigration resistance thereof.

To meet such requirements, copper (Cu), which has higher conductivity (lower resistance) than aluminum (Al) or tungsten (W) and has high electromigration resistance, is used as a wiring material.

As a method for forming a Cu wiring, there is proposed a technique in which a barrier film made of, for example, tantalum metal (Ta), titanium (Ti), tantalum nitride (TaN) or titanium nitride (TiN) is formed on an entire surface of an interlayer insulating film, which is formed on a wafer and provided with a trench and a via, by plasma sputtering as a physical vapor deposition (PVD) method; a Cu seed film is formed on the barrier film by the plasma sputtering as well; and Cu is plated on the Cu seed film to fill the trench and the via completely; residues of the copper thin film and the barrier film on a surface of the wafer is removed by CMP (Chemical Mechanical Polishing) (see for example, Patent Document 1).

However, a design rule of the semiconductor device is getting more miniaturized, and Cu has poor wettability for the barrier film. Besides, the PVD essentially has a low step coverage. Thus, in the technique described in Patent Document 1, it is difficult to form the Cu seed layer within the trench and the via appropriately, and the Cu seed layer narrows an opening of the trench and the via. If the Cu plating is performed in this state to bury the Cu in the trench and the via, a void may be formed in the buried Cu film.

In this regard, for the purposes of improving burying property of a fine wiring, there is proposed a technique in which Cu is buried after forming a Ru film having high wettability for Cu on a barrier film made of Ta or TaN by CVD (Chemical Vapor Deposition) which essentially has a high step coverage (see, for example, Patent Document 2). Furthermore, there is also proposed a technique of burying a Cu film by ionized PVD (Physical Vapor Deposition) (iPVD) after forming the Ru film by the CVD as described above (see, for example, Patent Document 3). By burying the Cu by the PVD, impurities can be reduced as compared to a case of performing the Cu plating. Thus, the Cu wiring may have lower resistance.

In addition, there is also proposed a technique in which a barrier film and a wetting target layer made of Ru or the like are formed, by CVD, on an entire surface of an interlayer insulating film provided with recesses such as a via and a trench; a Cu film is formed by PVD; and a semiconductor wafer is then heated to reflow Cu on a surface thereof so that the recesses are filled with Cu (see, for example, Patent Document 4).

These techniques may be also applicable to a case of burying a Cu alloy in a recess by using a Cu alloy film instead of the Cu film.

Patent Document 1: Japanese Patent Laid-open Publication No. 2006-148075

Patent Document 2: Japanese Patent Laid-open Publication No. 2010-021447

Patent Document 3: Japanese Patent Laid-open Publication No. 2012-169590

Patent Document 4: Japanese Patent Laid-open Publication No. 2009-105289

DISCLOSURE OF THE INVENTION

Problems to be Solved by the Invention

By the technique of the Patent Document 3, Cu can be buried in a fine trench and a Cu wiring having low resistance can be formed. In case of burying Cu in both of the trench and the via in a dual damascene structure, in which the trench and the via are formed, by using this technique, however, Cu grains may be formed at a bottom portion of the trench, so that the burial of Cu in the via may be suppressed.

Meanwhile, though the technique of the Patent Document 4 is effective for the fine trench, a single wafer may have trenches of various widths, and it has poor efficiency for a trench having a large width.

In view of the foregoing problems, exemplary embodiments provide a Cu wiring forming method and a semiconductor device manufacturing method capable of forming a Cu wiring having low resistance by burying Cu or Cu alloy in a trench and a via formed in a substrate with high burying property and high efficiency.

Means for Solving the Problems

In a first aspect of the exemplary embodiment, there is provided a Cu wiring forming method of forming, on a substrate having on a surface thereof a film provided with a trench of a preset pattern and a via formed at a bottom of the trench, a Cu wiring by burying Cu or Cu alloy in the trench and the via. The Cu wiring forming method includes forming a barrier film on a surface of the film; forming, on a surface of the barrier film, a wetting target layer made of a metal material to be wet with the Cu or Cu alloy; forming, on a surface of the wetting target layer, a Cu-based seed film made of the Cu or Cu alloy by PVD; filling the via by heating the substrate on which the Cu-based seed film is already formed and flowing the Cu-based seed film into the via; and forming, on the surface of the substrate on which the via is already filled, a Cu-based film made of the Cu or Cu alloy by PVD under a condition that allows the Cu-based film to be flown on the wetting target layer to bury the Cu-based film in the trench.

In a second aspect of the exemplary embodiment, there is provided a semiconductor device manufacturing method of manufacturing, on a substrate having thereon an interlayer insulating film provided with a trench of a preset pattern and a via connecting a bottom portion of the trench and a lower wiring, a semiconductor device by burying Cu or Cu alloy in the trench and the via to form a Cu wiring. The semiconductor device manufacturing method includes forming a barrier film on a surface of the interlayer insulating film; forming, on a surface of the barrier film, a wetting target layer made of a metal material to be wet with the Cu or Cu alloy; forming, on a surface of the wetting target layer, a Cu-based seed film made of the Cu or Cu alloy by PVD; filling the via by heating the substrate on which the Cu-based seed film is already formed and flowing the Cu-based seed film into the via; forming, on a surface of the substrate on which the via is already filled, a Cu-based film made of the Cu or Cu alloy by PVD under a condition that allows the Cu-based film to be flown on the wetting target layer to bury the Cu-based film in the trench; and forming the Cu wiring by polishing an entire surface and removing the Cu-based film, the wetting target layer and the barrier film on a surface except the trench.

In a third aspect of the exemplary embodiment, there is provided a computer-readable recording medium having stored thereon computer-executable instructions that, in response to execution, cause a Cu wiring forming system to perform a Cu wiring forming method as described in the first aspect of the exemplary embodiment.

According to the exemplary embodiments, after forming the wetting target layer to be wetted with the Cu or Cu alloy, by forming and heating the Cu-based seed film, the Cu-based seed film is allowed to be flown. Thus, the Cu or Cu alloy can be easily buried in the fine via. Furthermore, after filling the via as stated above, the Cu-based film is buried in the trench by forming the Cu-based film by PVD under a condition that allows the Cu-based film to be moved on the wetting target layer having the high wettability for the Cu or Cu alloy. Therefore, high burying property can be obtained without the hindrance of the burial within the via. In addition, since the Cu or Cu alloy is buried by the PVD as stated above, the amount of impurities can be reduced as compared to the plating. As a consequence, the resistance of the Cu wiring can be further reduced. In addition, since only the via is filled by heating and flowing the Cu-based seed film, it is not necessary to perform inefficient processings such as performing the reflow on the trench having a large width. Thus, high efficiency can be achieved.

As the PVD for forming the Cu-based film, it may be desirable to use high-temperature ionized PVD. By forming the Cu-based film by the high-temperature ionized PVD, the crystal size of the Cu or Cu alloy can be enlarged, so that the resistance of the Cu wiring can be further reduced.

DETAILED DESCRIPTION

Hereinafter, exemplary embodiments will be described in detail with reference to the accompanying drawings, which form a part of the description.

<Exemplary Embodiment of Cu Wiring Forming Method>

Figure 1:
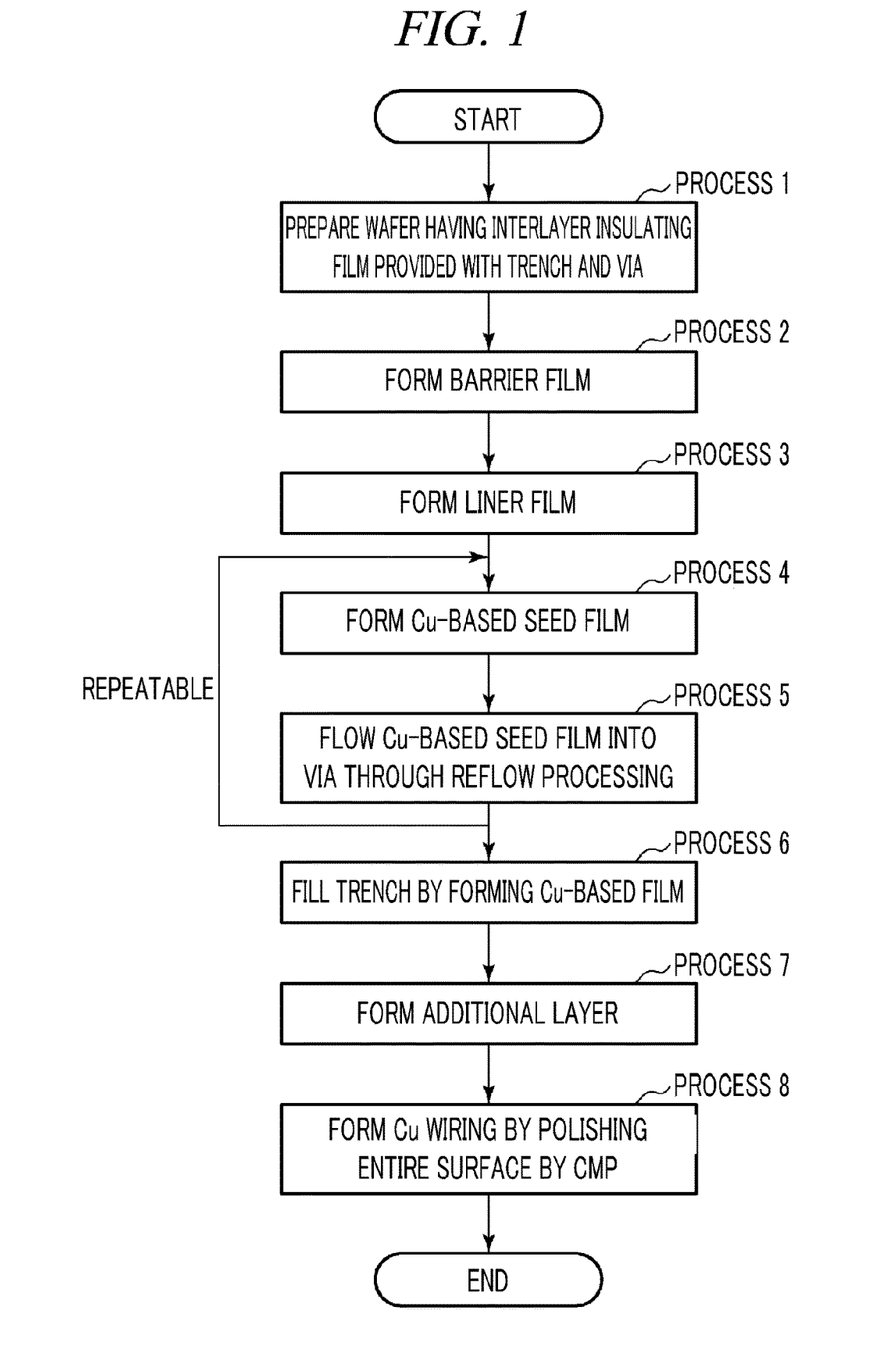
FIG. 1 is a flowchart for describing a Cu wiring forming method according to an exemplary embodiment.

First, an exemplary embodiment of a Cu wiring forming method according to the present disclosure will be explained with reference to a flowchart of FIG. 1 and cross sectional views of FIG. 2A to FIG. 2H. In the exemplary embodiment, a Cu wiring is formed by burying Cu or Cu alloy in a trench and a via collectively.

First, there is prepared a wafer W in which an interlayer insulating film 202, which is made of a $SiO_2$ film, a low-dielectric (Low-k) film (SiCO, SiCOH, etc.) or the like, is formed on a lower structure 201 (details of which are omitted) including a lower wiring 211 (process 1, FIG. 2A)), and the interlayer insulating film 202 is provided with a trench 203 and a via 204 formed in a preset pattern. The via 204 is extended from a bottom portion of the trench 203 to the lower wiring 211. As for this wafer W, it may be desirable to remove an etching/ashing residue and moisture on a surface of the insulating film by a degas processing or a pre-clean processing.

Figures 2A, 2E:
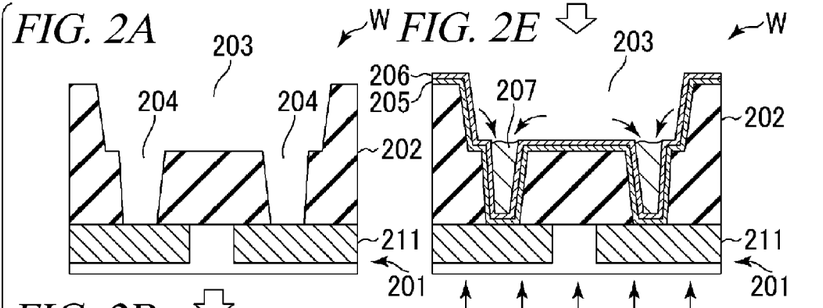
FIG. 2A to FIG. 2H are cross sectional views illustrating a process sequence of the Cu wiring forming method according to the exemplary embodiment.
Figures 2B, 2F:
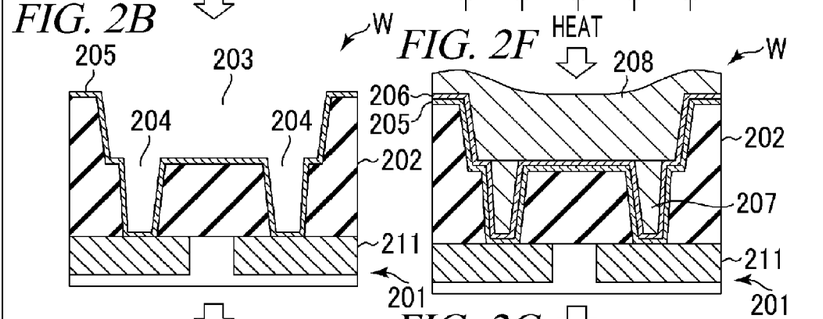

Next, a barrier film 205 configured to suppress diffusion of Cu is formed on an entire surface including surfaces of the trench 203 and the via 204 (process 2, FIG. 2B).

It is desirable that the barrier film 205 has high barrier property against Cu and low resistance. By way of example, a Ti film, a TiN film, a Ta film, a TaN film, a double-layered film of Ta/TaN or a Mn film may be appropriately used as the barrier film 205. Further, a TaCN film, a W film, a WN film, a WCN film, a Zr film, a ZrN film, a V film, a VN film, a Nb film, a NbN film or the like may be used as the barrier film 205. The barrier film may be formed by ionized PVD (Ionized Physical Vapor Deposition; iPVD) in which a film is formed while attracting ions into the wafer. Further, the barrier film may be formed by another PVD such as typical sputtering, ion plating or the like, or may be formed by CVD or ALD (Atomic Layer Deposition). The CVD or ALD may be performed by using plasma.

From the viewpoint of further reducing the resistance of the Cu wiring, it is desirable to form the barrier film to have a thin thickness of, desirably, 1 nm to 10 nm. Since a Mn film is silicated by reacting with Si in the interlayer insulating film 202 and the barrier film 205 can be formed at a side of the interlayer insulating film 202 as a self-assembled barrier film, a volume of Cu in the Cu wiring can be increased, so that a high effect of reducing the resistance of the Cu wiring can be achieved. Therefore, it is desirable to use the Mn film in the aspect of reducing the resistance of the Cu wiring.

Appropriately, the Mn film may be formed by CVD or ALD. As a method for forming the Mn film by the CVD or ALD, a method described in Japanese Patent Laid-open Publication No. 2014-135465 may be used.

Subsequently, a liner film 206 as a wetting target layer for securing wettability for the Cu or Cu alloy is formed on the barrier film 205 (process 3, FIG. 2C). As the liner film 206, a Co film or a Ru film having especially high wettability for Cu may be appropriately utilized.

Since the liner film 206 as the wetting target layer has high wettability for the Cu or Cu alloy, it is possible to obtain high fluidity (mobility) of the Cu or Cu alloy when performing a reflow processing on the Cu-based film and forming the Cu-based film by PVD. From the viewpoint of reducing the resistance of the Cu wiring by maximizing the volume of the buried Cu, it may be desirable to form the liner film 206 to have a thin thickness of, e.g., 1 nm to 5 nm.

It may be desirable to form the liner film 206 by CVD. By the CVD, the liner film 206 can be formed to have a smaller thickness with a higher step coverage. In case of using a Ru film as the liner film 206, it may be desirable to use, for example, ruthenium carbonyl ($Ru_3(CO)_{12}$) as a film forming source material and to form the liner film by thermal CVD. Other than the ruthenium carbonyl, another film forming source material, for example, a pentadienyl compound of ruthenium, such as (cyclopentadienyl)(2,4-dimethylpentadienyl)ruthenium, bis(cyclopentadienyl)(2,4-methylpentadienyl)ruthenium, (2,4-dimethylpentadienyl)(ethylcyclopentadienyl)ruthenium, or bis(2,4-methylpentadienyl) (ethylcyclopentadienyl) ruthenium, may be used. Furthermore, instead of the CVD, ALD (Atomic Layer Deposition) may be used. Moreover, the liner film may be formed by PVD. In case of using a Co film, the film can be formed by CVD, ALD, or PVD, in the same manner as in the case of using the Ru film.

Figures 2C, 2G:
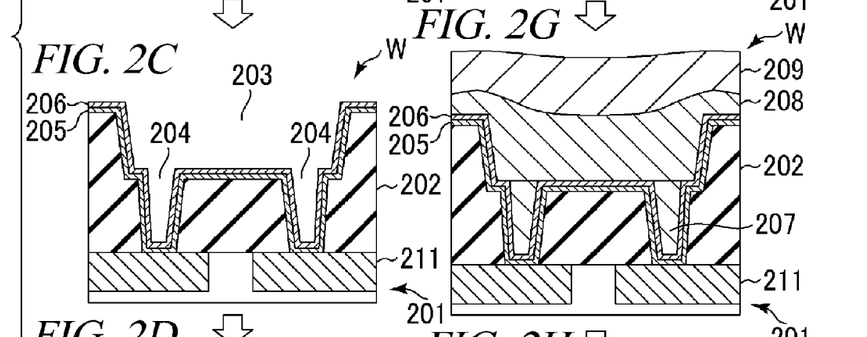
Figures 2D, 2H:
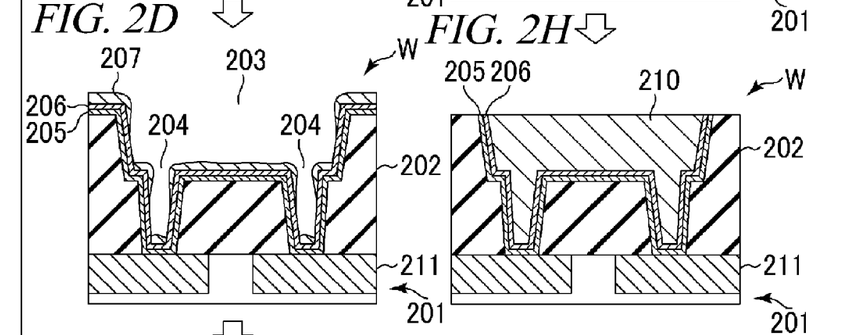

Thereafter, a Cu-based seed film 207 made of Cu or Cu alloy is formed on a surface of the liner film 206 by PVD (process 4, FIG. 2D). This Cu-based seed film 207 is formed to secure the Cu or Cu alloy to be buried in the via 204 through a subsequent reflow processing. Thus, a thickness of the Cu-based seed film 207 only needs to correspond to a small amount for filling the via 204, for example, about 1 nm to 40 nm. Further, since the via 204 needs to be filled by the reflow, the Cu-based seed film 207 need not be a continuous film.

Furthermore, in case of using the Cu alloy as the Cu-based seed film 207, Cu—Al or Cu—Mn may be typically utilized. Alternatively, another Cu alloy such as Cu—Mg, Cu—Ag, Cu—Sn, Cu—Pb, Cu—Zn, Cu—Pt, Cu—Au, Cu—Ni, Cu—Co, Cu—Ti, or the like may be used.

As long as the Cu-based seed film 207 is formed on inner walls of the trench 203 and the via 204, the type of the PVD method is not particularly limited as an overhang or the like need not be considered. If, however, the via 204 or the trench 203 is blocked by the Cu-based seed film 207, the subsequent reflow processing cannot be performed. In consideration of this, the Cu based seed film 207 need to have a film thickness and a coverage so as not to block the trench 203 or the via 204, and it may be desirable to use the iPVD in which the film formation is performed while attracting ions into the wafer.

After the Cu-based seed film 207 is formed, the reflow processing is performed by heating the wafer W (process 5, FIG. 2E). Through this reflow processing, the Cu-based seed film 207 made of the Cu or Cu alloy is flown into the via 204 and fills the via 204. Desirably, a heating temperature for the reflow processing may be in the range from 200° C. to 400° C. If the heating temperature is lower than 200° C., it may be difficult for the Cu-based seed film 207 to be flown, whereas if the heating temperature is higher than 400° C., the Cu or Cu alloy forming the Cu-based seed film 207 may be easily aggregated to have an adverse effect on the underlying interlayer insulating film 202 made of the Low-k film or the like. Further, in case that the trench cannot be filled sufficiently by performing the formation of the Cu-based seed film in the process 4 and the reflow processing in the process 5 only one time, the processes 4 and 5 may be repeated multiple times.

The reflow processing may be performed by, for example, placing the wafer on a stage within a chamber, evacuating the chamber while introducing an inert gas such as an Ar gas, a $N_2$ gas or a $H_2$ gas into the chamber, maintaining the inside of the chamber under a preset vacuum atmosphere and heating the wafer by a resistance heater embedded in the stage.

Figure 3:
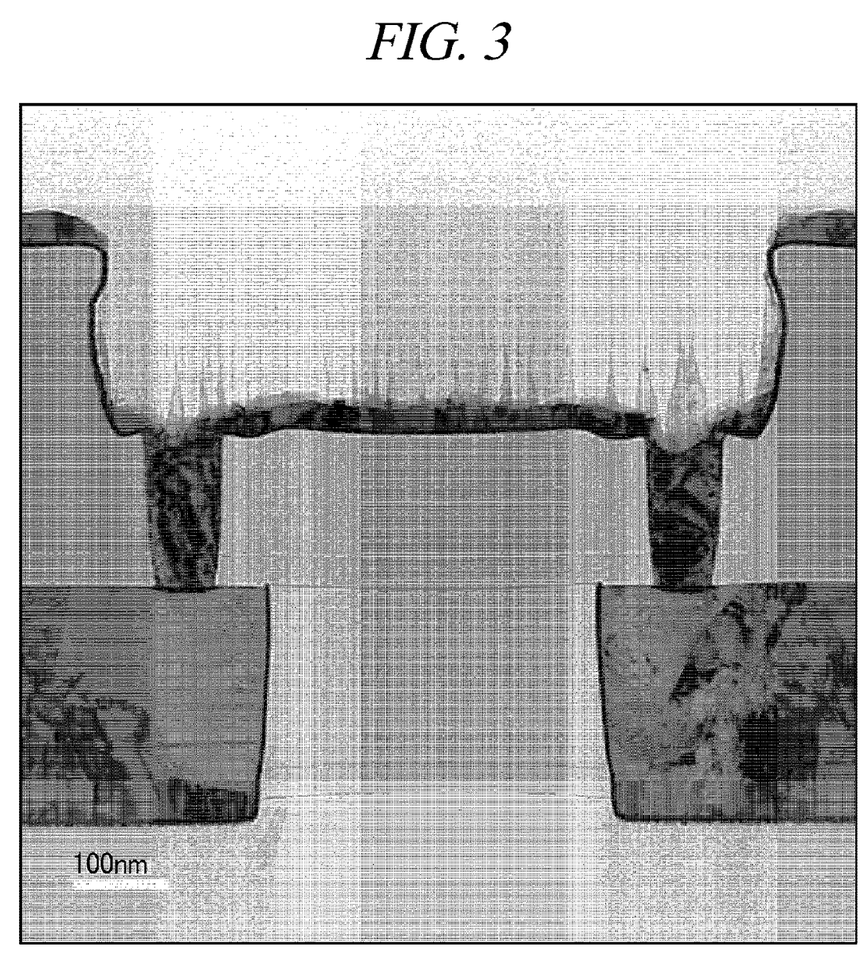
FIG. 3 is a TEM image showing a cross sectional state in which, after forming a Cu seed film, a reflow processing is performed by heating it at 400° C.

As a result of performing an actual experiment in which a TaN barrier film, a Ru liner film and a Cu seed film are formed on a wafer having an interlayer insulating film provided with a trench and a via and then the reflow processing is performed on this wafer by heating the wafer at 400° C., it is observed that the via is completely filled with Cu, as illustrated in a TEM (Transmission Electron Microscope) image of FIG. 3.

After the reflow processing, by forming a Cu-based film 208, which is made of the Cu or Cu alloy, on a surface of the liner film 206 having the high wettability for the Cu or Cu alloy by PVD under conditions allowing the Cu-based film 208 to be flown on the liner film 206, the Cu-based film 208 is buried in the trench 203 (process 6, FIG. 2F). At this time, it may be desirable to form the Cu-based film 208 by the iPVD which enables easily securing fluidity of the Cu or Cu alloy on the liner film 206.

In case of typical film formation by the PVD, the overhang in which an opening of a trench or a via is clogged due to the aggregation of Cu may be easily caused. In accordance with the present exemplary embodiment, however, by using the iPVD in which the film formation is performed while attracting ions into the wafer and controlling, by adjusting a bias power applied to the wafer, a film forming operation by Cu ions and an etching operation by ions (Ar ions) of a plasma generation gas, the Cu or Cu alloy is allowed to be moved on the liner film 206 having high wettability for the Cu or Cu alloy without being aggregated, so that the generation of the overhang can be suppressed. Therefore, even in case that the trench or the via has a small opening, the high burying property in which the void or the like is not generated can be obtained. Here, from the viewpoint of obtaining high burying property by allowing the Cu to have fluidity, it may be desirable to perform a high-temperature processing (65° C. to 350° C., desirably, 230° C. to 300° C.) in which the Cu migrates. Further, by performing the PVD film formation through the high-temperature processing, a Cu crystal grain is allowed to be grown, so that the resistance of the Cu wiring can be reduced.

In case of filling both the trench and the via at the same time by the above-described method, however, Cu grains may be formed at the bottom portion of the trench, so that the burial of the Cu within the via may be suppressed. In the present exemplary embodiment, however, since the via 204 is already filled through the reflow processing in the process 5, such a problem can be avoided.

Furthermore, in this process, in case that an opening width of the trench 203 is small, the trench 203 can be almost completely filled with the Cu or Cu alloy. If the opening width of the trench 203 is large, a slight recess may be generated, which is regarded to be acceptable here. Furthermore, in the formation of the Cu-based film 208, an internal pressure of a processing vessel (processing pressure) may be set to be, desirably, in the range from 1 mTorr to 100 mTorr (0.133 Pa to 13.3 Pa), more desirably, in the range from 35 mTorr to 90 mTorr (4.66 Pa to 12.0 Pa).

In case of using the Cu alloy as the Cu-based film 208, Cu—Al or Cu—Mn may be typically used. Alternatively, another Cu alloy such as Cu—Mg, Cu—Ag, Cu—Sn, Cu—Pb, Cu—Zn, Cu—Pt, Cu—Au, Cu—Ni, Cu—Co, Cu—Ti, or the like may be utilized.

Figure 4:
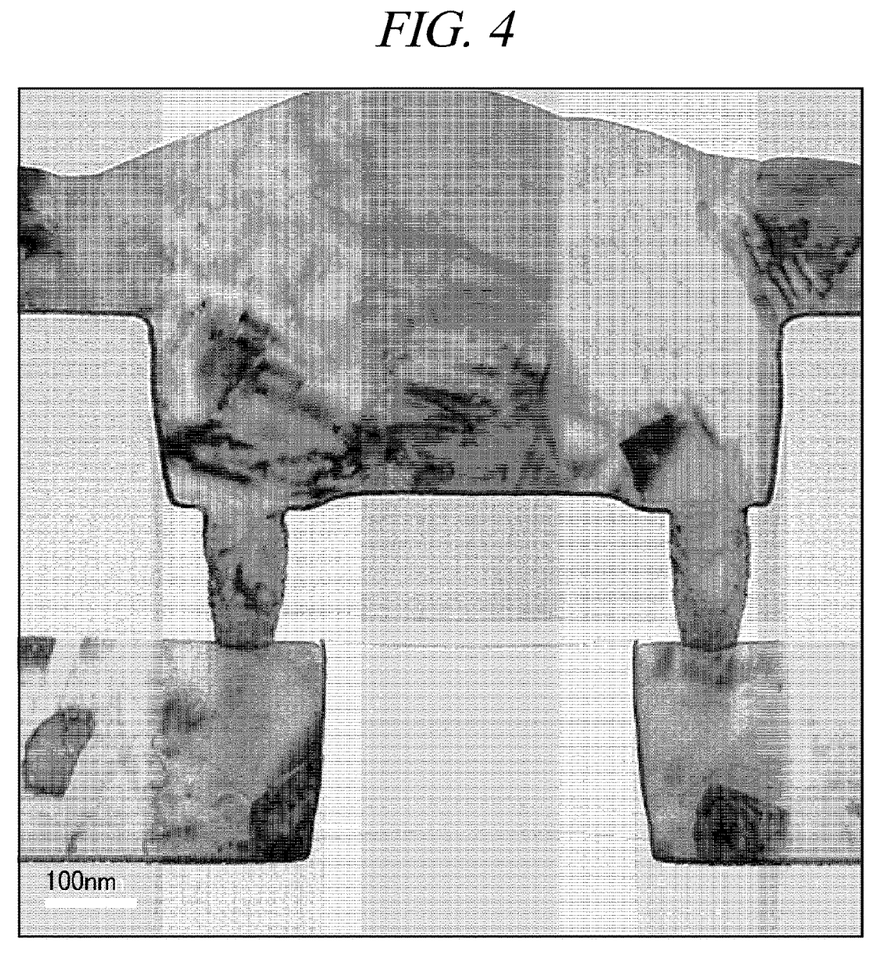
FIG. 4 is a TEM image showing a cross sectional state in which, after the reflow processing, Cu is buried within a trench by iPVD.

As a result of performing an actual experiment in which the trench is filled by forming the Cu film through the iPVD under a high temperature condition after filling the via through the reflow processing, it is observed that the trench is completely filled with Cu, as illustrated in a TEM image of FIG. 4.

After the Cu or Cu alloy is buried in the trench 203 as stated above, an additional layer 209 made of the Cu or Cu alloy is formed on the Cu-based film 208, when necessary, in preparation for a subsequent planarizing processing (process 7, FIG. 2G). The additional layer 209 may be prepared by forming a Cu-based film by PVD such as iPVD after forming the Cu-based film 208. Alternatively, the additional layer 209 may be formed by Cu plating.

Afterwards, the wafer W is planarized by removing the additional layer 209, the Cu-based film 208, the liner film 206, and the barrier film 205 on the surface of the wafer W by CMP (Chemical Mechanical Polishing) (process 8, FIG. 2H). As a result, a Cu wiring 210 is obtained.

As stated above, according to the present exemplary embodiment, by forming the liner film 206 as the wetting target layer to be wetted with the Cu or Cu alloy; forming the Cu-based seed film 207; and then performing the reflow processing by heating, the Cu-based seed film 207 is allowed to be flown (moved). Thus, the Cu or Cu alloy can be easily buried in the fine via 204. Furthermore, after filling the via 204 through the reflow processing as stated above, the Cu-based film 208 is buried in the trench 203 by forming the Cu-based film 208 on the liner film 206 having the high wettability for the Cu or Cu alloy by PVD under a condition that allows the Cu-based film 208 to be moved on the liner film 206, suitably, by iPVD at a high temperature. Therefore, high burying property can be obtained without the hindrance of the burial within the via 204. In addition, since the Cu or Cu alloy is buried by the PVD as stated above, the amount of impurities can be reduced as compared to the plating. As a consequence, the resistance of the Cu wiring can be further reduced. Furthermore, since the film formation is performed by the iPVD at the high temperature, a crystal size of the Cu or Cu alloy can be increased, so that further lower resistance of the Cu wiring can be achieved. In addition, since only the via 204 is filled through the reflow, it is not necessary to perform inefficient processings such as performing a reflow on the trench having a large width. Thus, high efficiency can be achieved. That is, by appropriately combining the reflow processing and the burial (dry fill) through the PVD, the Cu or Cu alloy can be buried in the trench 203 and the via 204 with higher burying property, so that the Cu wiring having lower resistance can be obtained.

<Film Forming System>

Figure 5:
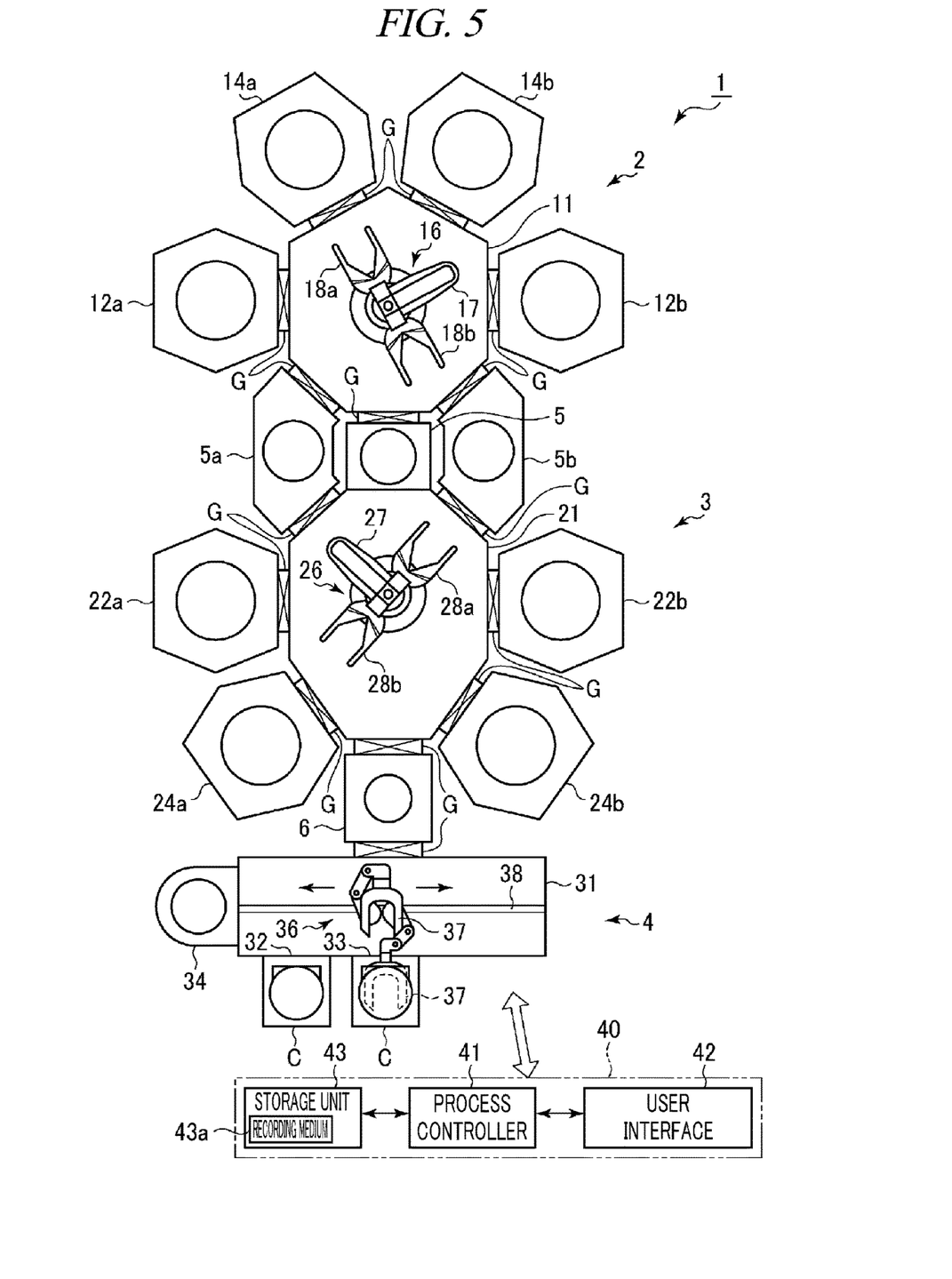
FIG. 5 is a plan view illustrating an example of a multi-chamber type film forming system for performing the Cu wiring forming method according to the exemplary embodiment.

Now, a film forming system for use in performing the Cu wiring forming method according to the present exemplary embodiment will be discussed. FIG. 5 is a schematic diagram illustrating an example of such a film forming system.

A film forming system 1 includes a first processing unit 2 configured to form a barrier film and a liner film; a second processing unit 3 configured to form a Cu film; and a carry-in/out unit 4. The film forming system 1 performs, upon a wafer W provided with a trench and a via in a preset pattern, a series of processings from formation of the barrier film to formation of an additional layer.

The first processing unit 2 is equipped with a first vacuum transfer chamber 11; and two barrier film forming apparatuses 12a and 12b and two liner film forming apparatuses 14a and 14b respectively connected to wall portions of the first vacuum transfer chamber 11. The barrier film forming apparatus 12a and the liner film forming apparatus 14a are arranged in line symmetry with the barrier film forming apparatus 12b and the liner film forming apparatus 14b.

Degas chambers 5a and 5b configured to perform a degas processing on the wafer W are connected to other wall portions of the first vacuum transfer chamber 11. Further, a delivery chamber 5 configured to deliver wafers W between the first vacuum transfer chamber 11 and a second vacuum transfer chamber 21 to be described later is connected to a wall portion of the first vacuum transfer chamber 11 between the degas chambers 5a and 5b.

The barrier film forming apparatuses 12a and 12b, the liner film forming apparatuses 14a and 14b, the degas chambers 5a and 5b and the delivery chamber 5 are connected to the respective sides of the first vacuum transfer chamber 11 via gate valves G, and are communicated with or isolated from the first vacuum transfer chamber 11 as the corresponding gate valves G are opened or closed.

The inside of the first vacuum transfer chamber 11 is maintained in a preset vacuum atmosphere, and a first transfer device 16 configured to transfer wafers W is provided therein. The first transfer device 16 is placed at a substantially center portion of the first vacuum transfer chamber 11 and is equipped with a rotating and extending/retracting portion 17 configured to be rotatable and extensible/retractable; and two supporting arms 18a and 18b provided at a leading end of the rotating and extending/retracting portion 17 and configured to hold the wafers W. The first transfer device 16 is configured to carry the wafers W into or out of the barrier film forming apparatuses 12a and 12b, the liner film forming apparatuses 14a and 14b, the degas chambers 5a and 5b and the delivery chamber 5.

The second processing unit 3 includes the second vacuum transfer chamber 21; two Cu-based film forming apparatuses 22a and 22b and two Cu-based seed film forming apparatuses 24a and 24b respectively connected to wall portions of the second vacuum transfer chamber 21. Each of the Cu-based film forming apparatuses 22a and 22b and the Cu-based seed film forming apparatuses 24a and 24b is implemented by an iPVD apparatus. The Cu-based film forming apparatus 22a and the Cu-based seed film forming apparatus 24a are arranged in line symmetry with the Cu-based film forming apparatus 22b and the Cu-based seed film forming apparatus 24b.

The degas chambers 5a and 5b are respectively connected to wall portions of the second vacuum transfer chamber 21 corresponding to two sides on the side of the first processing unit 2, and the delivery chamber 5 is connected to a wall portion of the second vacuum transfer chamber 21 between the degas chambers 5a and 5b. That is, the delivery chamber 5 and the degas chambers 5a and 5b are all provided between the first vacuum transfer chamber 11 and the second vacuum transfer chamber 21, and the degas chambers 5a and 5b are arranged at both sides of the delivery chamber 5. Further, a load lock chamber 6 capable of being switched between an atmospheric transfer mode and a vacuum transfer mode is connected to a wall portion of the second vacuum transfer chamber 21 on the side of the carry-in/out unit 4.

The Cu-based film forming apparatuses 22a and 22b, the Cu-based seed film forming apparatuses 24a and 24b, the degas chambers 5a and 5b and the load lock chamber 6 are connected to respective wall portions of the second vacuum transfer chamber 21 via gate valves G, and are communicated with the second vacuum transfer chamber 21 as the corresponding gate valves G are opened and isolated from the second vacuum transfer chamber 21 as the corresponding gate valves G are closed. Further, the delivery chamber 5 is directly connected to the second vacuum transfer chamber 21 without a gate valve therebetween.

The inside of the second vacuum transfer chamber 21 is maintained in a preset vacuum atmosphere, and a second transfer device 26 configured to carry the wafers W into or out of the Cu-based film forming apparatuses 22a and 22b, the Cu-based seed film forming apparatuses 24a and 24b, the degas chambers 5a and 5b, the load lock chamber 6 and the delivery chamber 5 is provided within the second vacuum transfer chamber 21. The second transfer device 26 is placed at a substantially center portion of the second vacuum transfer chamber 21 and is equipped with a rotating and extending/retracting unit 27 configured to be rotatable and extensible/retractable. Two supporting arms 28a and 28b configured to hold the wafers W are provided at a leading end of the rotating and extending/retracting unit 27. The two supporting arms 28a and 28b are mounted to the rotating and extending/retracting unit 27 such that they face to the opposite directions.

The carry-in/out unit 4 is provided at the opposite side from the second processing unit 3 with the load lock chamber 6 therebetween, and is equipped with an atmospheric transfer chamber 31 to which the load lock chamber 6 is connected. A filter (not shown) is provided at an upper portion of the atmospheric transfer chamber 31 to form a downflow of clean air. A gate valve G is provided at a wall portion between the load lock chamber 6 and the atmospheric transfer chamber 31. Two connection ports 32 and 33 are provided at a wall portion of the atmospheric transfer chamber 31 opposite from the wall portion to which the load lock chamber 6 is connected, and carriers C for accommodating wafers W as the processing targets therein are connected to the two connection portions 32 and 33. Further, an alignment chamber 34 configured to perform alignment of the wafers W is provided at a lateral side of the atmospheric transfer chamber 31. The atmospheric transfer chamber 31 incorporates therein a transfer device 36 for atmospheric transfer configured to perform carry-in/out of the wafers W into/from the carriers C and carry-in/out of the wafers W into/from the load lock chamber 6. This transfer device 36 for atmospheric transfer is equipped with two multi-joint arms and is configured to be moved on a rail 38 along an arrangement direction of the carriers C. This transfer device 36 transfers the wafers W while holding the wafers W on leading end hands 37 of the two multi-joint arms.

Further, since the Cu-based film forming apparatuses 22a and 22b are configured to be able to heat the wafer W, these apparatuses can be used as heating apparatuses when performing a reflow processing. Here, however, another apparatus capable of heating the wafer, for example, degas chambers 5a and 5b can be used as heating apparatuses, or a separate heating apparatus may be provided.

This film forming system 1 includes a control unit 40 configured to control the individual components of the film forming system 1. The control unit 40 includes a process controller 41 having a microprocessor (computer) configured to control the individual components; a user interface 42 including a keyboard through which an operator inputs commands or the like to manage the film forming system 1, a display configured to visually display an operational status of the film forming system 1, and the like; and a storage unit 43 having stored thereon a control program for implementing various processings performed in the film forming system 1 under the control of the process controller 41, and a program for allowing each component of the processing apparatus to perform a processing according to various data and processing conditions, i.e., processing recipes. The user interface 42 and the storage unit 43 are connected to the process controller 41. The processing recipes are stored in a recording medium 43a within the storage unit 43. The recording medium may be a hard disk, or may be a portable device such as a CD-ROM, a DVD, or a flash memory, or the like. Further, the processing recipes may be appropriately transmitted from another apparatus through, e.g., a dedicated line. A necessary recipe is retrieved from the storage unit 43 and executed by the process controller 41 in response to an instruction from the user interface 42, so that a desired processing is performed in the film forming system 1 under the control of the process controller 41.

In this film forming system 1, a wafer W having a trench and a via in a preset pattern is taken out of a carrier C by the transfer device 36 for atmospheric transfer and transferred into the load lock chamber 6. After the load lock chamber is decompressed to a vacuum level substantially the same as that of the second vacuum transfer chamber 21, the wafer W is transferred from the load lock chamber into the degas chamber 5a or 5b via the second vacuum transfer chamber 21 by the second transfer device 26, and a degas processing is performed on the wafer W.

Thereafter, the wafer W is taken out of the degas chamber by the first transfer device 16 and carried into the barrier film forming apparatus 12a or 12b via the first vacuum transfer chamber 11, and a barrier film is formed on the wafer W.

After the barrier film is formed, the wafer W is taken out of the barrier film forming apparatus 12a or 12b by the first transfer device 16 and carried into the liner film forming apparatus 14a or 14b and a Ru film, for example, is formed as a liner film.

After the liner film is formed, the wafer W is taken out of the liner film forming apparatus 14a or 14b by the first transfer device 16 and transferred into the delivery chamber 5. Thereafter, the wafer W is taken out by the second transfer device 26 and carried into the Cu-based seed film forming apparatus 24a or 24b via the second vacuum transfer chamber 21, so that a Cu-based seed film is formed by iPVD. Further, when forming the Cu-based seed film, burying property of the film need not be considered. Thus, the formation of the Cu-based seed film is performed without heating the wafer W.

Subsequently, the wafer W is taken out by the second transfer device 26 and carried into the Cu-based film forming apparatus 22a or 22b, and a reflow processing is performed by heating the wafer W, so that the Cu-based seed film is introduced into the via and fills the via.

After the reflow processing, a Cu-based film is formed on the wafer W by high-temperature iPVD in the Cu-based film forming apparatus in which the reflow processing is performed, so that a Cu or Cu alloy is buried in the trench.

Thereafter, an additional layer is formed on the Cu-based film. The formation of the additional layer may be implemented by forming a Cu alloy film consecutively within the same Cu-based film forming apparatus 22a or 22b. Alternatively, the additional layer may be formed by the Cu-based seed film forming apparatus 24a or 24b since burying property need not be considered when forming the additional layer.

After the additional layer is formed, the wafer W is transferred into the load lock chamber 6. Then, after the load lock chamber is returned back to an atmospheric pressure, the wafer W having the Cu film formed thereon is taken out of the load lock chamber by the transfer device 36 for atmospheric transfer and returned back into the carrier C. The above-described series of processes are repeated as many times as the number of the wafers W accommodated in the carrier C. The wafer W having the additional layer formed thereon is transferred into a CMP apparatus, and a CMP processing is performed, so that a Cu wiring is obtained.

In the film forming system 1, the formation of the barrier film, the liner film, the Cu-based seed film, the reflow processing and the formation of the Cu-based film and the additional layer are performed in a vacuum without being opened to the atmosphere. Thus, surface oxidation can be maximally suppressed when performing the individual processings, so that a high-performance Cu wiring can be obtained.

Moreover, the additional layer can be formed by Cu plating. In such a case, after the Cu-based film is formed, the wafer W is carried out of the film forming system 1. Then, Cu-plating is performed in a plating apparatus, and, subsequently, a CMP processing is performed in a CMP apparatus.

In addition, since the wafer W need not be heated in forming the Cu-based seed film whereas the wafer W is heated in forming the Cu-based film, the Cu-based seed film forming apparatus 24a (24b) and the Cu-based film forming apparatus 22a (22b) are separately provided to achieve high throughput. However, they may be configured as a single apparatus and only a temperature may be set differently. In such a case, the formation of the Cu-based seed film, the reflow processing and the formation of the Cu-based film can be performed in the single apparatus.

Now, major apparatuses of the film forming system will be explained.

<Cu-Based Film Forming Apparatus>

Figure 6:
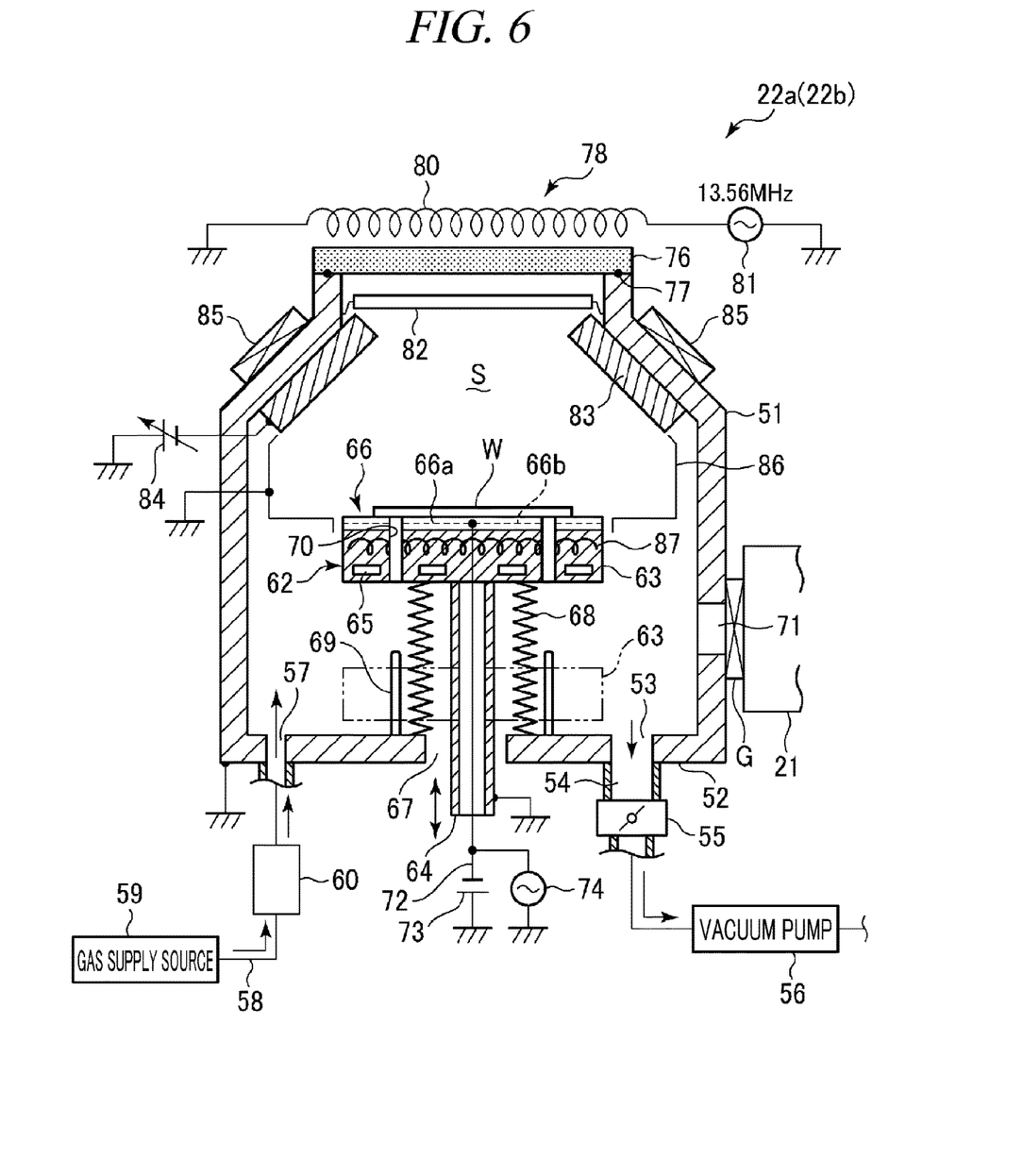
FIG. 6 is a cross sectional view illustrating a Cu-based film forming apparatus provided in the film forming system of FIG. 5 and configured to form a Cu-based film.

An appropriate example of the Cu-based film forming apparatus 22a (22b) for use in forming a Cu-based film, which is a major processing of the present disclosure, will be discussed. FIG. 6 is a cross sectional view illustrating an example of the Cu-based film forming apparatus.

Here, an ICP (Inductively Coupled Plasma) type plasma sputtering apparatus will be described as an example of an iPVD film forming apparatus which is used as the Cu-based film forming apparatus.

As depicted in FIG. 6, the Cu-based film forming apparatus 22a (22b) includes a cylindrical processing vessel 51 made of a metal. The processing vessel 51 is grounded, and a gas exhaust opening 53 is provided at a bottom portion 52 of the processing vessel 51. The gas exhaust opening 53 is connected with a gas exhaust line 54. The gas exhaust line 54 is connected with a throttle valve 55 and a vacuum pump 56 configured to adjust a pressure. The inside of the processing vessel 51 is configured to be vacuum evacuated. Further, a gas inlet opening 57 through which a preset gas is introduced into the processing vessel 51 is provided at the bottom portion 52 of the processing vessel 51. The gas inlet opening 57 is connected with a gas supply line 58, and the gas supply line 58 is connected to a gas supply source 59 configured to supply a rare gas (e.g., an Ar gas) as a gas for plasma generation (excitation) and/or another necessary gas (e.g., a $N_2$ gas). Furthermore, the gas supply line 58 is equipped with a gas control unit 60 including a gas flow rate controller, a valve, and the like.

A mounting device 62 for the wafer W is provided within the processing vessel 51. The mounting device 62 includes a conductive mounting table 63 having a circular plate shape; and a hollow cylindrical supporting column 64 configured to support the mounting table 63. The mounting table 63 is grounded via the supporting column 64. A cooling jacket 65 and a resistance heater 87 provided above the cooling jacket 65 are embedded in the mounting table 63. The mounting table 63 is equipped with a thermocouple (not shown), and a wafer temperature is controlled by the cooling jacket 65 and the resistance heater 87 based on a temperature detected by the thermocouple.

A thin circular plate-shaped electrostatic chuck 66 having a dielectric member 66a and an electrode 66b embedded therein is provided at a top surface side of the mounting table 63, and configured to attract and hold the wafer W by an electrostatic force. Further, a lower portion of the supporting column 64 is extended downwards through an insertion through hole 67 provided at a central portion of the bottom portion 52 of the processing vessel 51. The supporting column 64 is configured to be movable up and down by an elevating device (not shown), and, accordingly, the entire mounting device 62 is moved up and down.

A metal bellows 68 configured to be extensible and contractible is provided to surround the supporting column 64. An upper end of the metal bellows 68 is hermetically jointed to a bottom surface of the mounting table 63, and a lower end of the metal bellows 68 is hermetically jointed to a top surface of the bottom portion 52 of the processing vessel 51. With this configuration, the mounting device 62 can be moved up and down while maintaining the airtightness of the processing vessel 51.

Further, for example, three (only two are shown) supporting pins 69 are provided vertically upwards at the bottom portion 52, and pin insertion through holes 70 are formed at the mounting table 63 to correspond to the supporting pins 69. Accordingly, when the mounting table 63 is lowered, the wafer W is received by upper end portions of the supporting pins 69 which protrude above the pin insertion through holes 70, and the wafer W can be transferred between the supporting pins 69 and a transfer arm (not shown) which is advanced from the outside. A carry-in/out opening 71 through which the transfer arm is advanced is provided at a lower sidewall of the processing vessel 51, and a gate valve G configured to be opened or closed is provided at the carry-in/out opening 71.

The electrode 66b of the electrostatic chuck 66 is connected to a chuck power supply 73 via a power supply line 72. The wafer W is attracted and held by an electrostatic force generated by applying a DC voltage to the electrode 66b from the chuck power supply 73. Further, the power supply line 72 is connected to a high frequency bias power supply 74, and a high frequency bias is applied to the wafer W by supplying a high frequency bias power to the electrode 66b of the electrostatic chuck 66 via the power supply line 72. A frequency of the high frequency bias is, desirably, 400 kHz to 60 MHz, for example, 13.56 MHz.

A high frequency transmission plate 76 made of a dielectric material is hermetically provided at a ceiling portion of the processing vessel 51 with a seal member 77 therebetween. Provided above this transmission plate 76 is a plasma generating source 78 configured to generate plasma in a processing space S within the processing vessel 51 by exciting a rare gas, for example, an Ar gas as a plasma exciting gas.

The plasma generating source 78 is equipped with an induction coil 80 provided to correspond to the transmission plate 76, and a high frequency power supply 81 for plasma generation having a frequency of, e.g., 13.56 MHz is connected to the induction coil 80. As a high frequency power is supplied to the induction coil 80, an inductive electric field is formed in the processing space S through the transmission plate 76.

Furthermore, a baffle plate 82 made of a metal and configured to diffuse the introduced high frequency power is provided directly under the transmission plate 76. A target 83 made of the Cu or Cu alloy and having an empty truncated cone shape is provided under the baffle plate 82 to surround an upper lateral side of the processing space S. The target 83 is connected to a variable DC power supply 84 configured to apply a DC power for attracting Ar ions. This power supply, however, can be implemented by an AC power supply, alternatively.

Further, a magnet 85 configured to apply a magnetic field to the target 83 is provided at an outside of the target 83. The target 83 is sputtered into metal atoms or metal atom groups of Cu by the Ar ions in the plasma, and most of these metal atoms or metal atom groups are ionized when they pass through the plasma.

Moreover, a protective cover member 86 having a cylindrical shape is provided under the target 83 to surround the processing space S. The protective cover member 86 is grounded, and an inner end portion thereof is provided to surround an outer peripheral side of the mounting table 63.

In the Cu-based film forming apparatus having the above-described configuration, a wafer W is carried into the processing vessel 51, and placed on the mounting table 63 and attracted by the electrostatic chuck 66. At this time, the mounting table 63 is temperature-controlled by the cooling jacket 65 or the resistance heater 87 based on a temperature detected by the thermocouple (not shown).

In this state, the following operations are performed under the control of the control unit 40.

First, an Ar gas is flown into the processing vessel 51 which is turned into a high vacuum state equal to or less than $1 \times 10^{-7}$ Torr by operating the vacuum pump 56. At this time, by operating the gas control unit 60, the Ar gas is flown at a preset flow rate, and by controlling the throttle valve 55, the inside of the processing vessel 51 is maintained at a preset vacuum level. Thereafter, a DC power is supplied to the target 83 from the variable DC power supply 84, and a high frequency power (plasma power) is additionally supplied to the induction coil 80 from the high frequency power supply 81 of the plasma generating source 78. Meanwhile, a preset high frequency bias power is supplied to the electrode 66b of the electrostatic chuck 66 from the high frequency bias power supply 74.

In the processing vessel 51, Ar plasma is generated by the high frequency power supplied to the induction coil 80, and the Ar ions in the Ar plasma are attracted by the DC voltage applied to the target 83 and made to collide with the target 83. As a result, the target 83 is sputtered, and particles are released therefrom. Here, the amount of the released particles is optimally controlled by the DC voltage applied to the target 83. Desirably, the DC power applied to the target 83 may be in the range from 4 kW to 12 kW, more desirably, 6 kW to 10 kW.

Further, most of the particles from the sputtered target 83 are ionized when they pass through the plasma and dispersed downwards in a state where the ionized particles and electrically neutral particles coexist. An ionization rate is controlled by the high frequency power supplied from the high frequency power supply 81.

If the ionized particles enter an ion sheath region having a thickness of several millimeters (mm) formed on a surface of the wafer W by the high frequency bias power applied to the electrode 66b of the electrostatic chuck 66 from the high frequency bias power supply 74, the ionized particles are attracted and accelerated towards the wafer W with high directivity, so that a Cu-based film is formed on the wafer W.

At this time, by setting a temperature of the wafer W to be high (ranging from 65° C. to 350° C.), fluidity of the Cu is achieved. Further, by mainly adjusting the high frequency bias power applied to the electrode 66b of the electrostatic chuck 66 from the high frequency bias power supply 74, film formation of the Cu alloy and etching by the Ar are adjusted to thereby obtain high fluidity of the Cu alloy. Thus, even in case of a trench having a narrow opening, the Cu or Cu alloy can be buried in this trench with high burying property. To elaborate, if a film formation amount (film forming rate) of the Cu-based film is defined as $T_D$ and an etching amount (etching rate) by the ions of the gas for plasma generation is defined as $T_E$, it may be desirable to adjust the bias power such that a relationship of $0 \leq T_E/T_D < 1$, more desirably, $0 < T_E/T_D < 1$ is established.

From the viewpoint of obtaining high burying property, it is desirable to set an internal pressure of the processing vessel 51 (i.e., a processing pressure) to be in the range from 1 mTorr to 100 mTorr (0.133 Pa to 13.3 Pa), more desirably, 35 mTorr to 90 mTorr (4.66 Pa to 12.0 Pa). Further, it is desirable to set the DC power to the target to be in the range from 4 kW to 12 kW, more desirably, 6 kW to 10 kW.

<Cu-Based Seed Film Forming Apparatus>

The Cu-based seed film forming apparatus 24a (24b) may be implemented by basically the same plasma sputtering apparatus as the Cu-based film forming apparatus 22a (22b) shown in FIG. 6 except that a resistance heater 87 is not provided in a mounting table 63. Further, burying property is not important when forming a Cu-based seed film, any of various typical PVD methods such as typical sputtering and ion plating may be used without being limited to iPVD.

<Barrier Film Forming Apparatus>

As the barrier film forming apparatus 12a (12b), the same film forming apparatus as shown in FIG. 6 may be used just by changing a material of the target 83, and a barrier film is formed by plasma sputtering. Further, without being limited to the plasma sputtering, any of various types of PVD methods such as typical sputtering and ion plating may be used, or the barrier film may be formed by CVD or ALD (Atomic Layer Deposition), or CVD or ALD using plasma. To reduce impurities, it is desirable to employ PVD.

<Liner Film Forming Apparatus>

Figure 7:
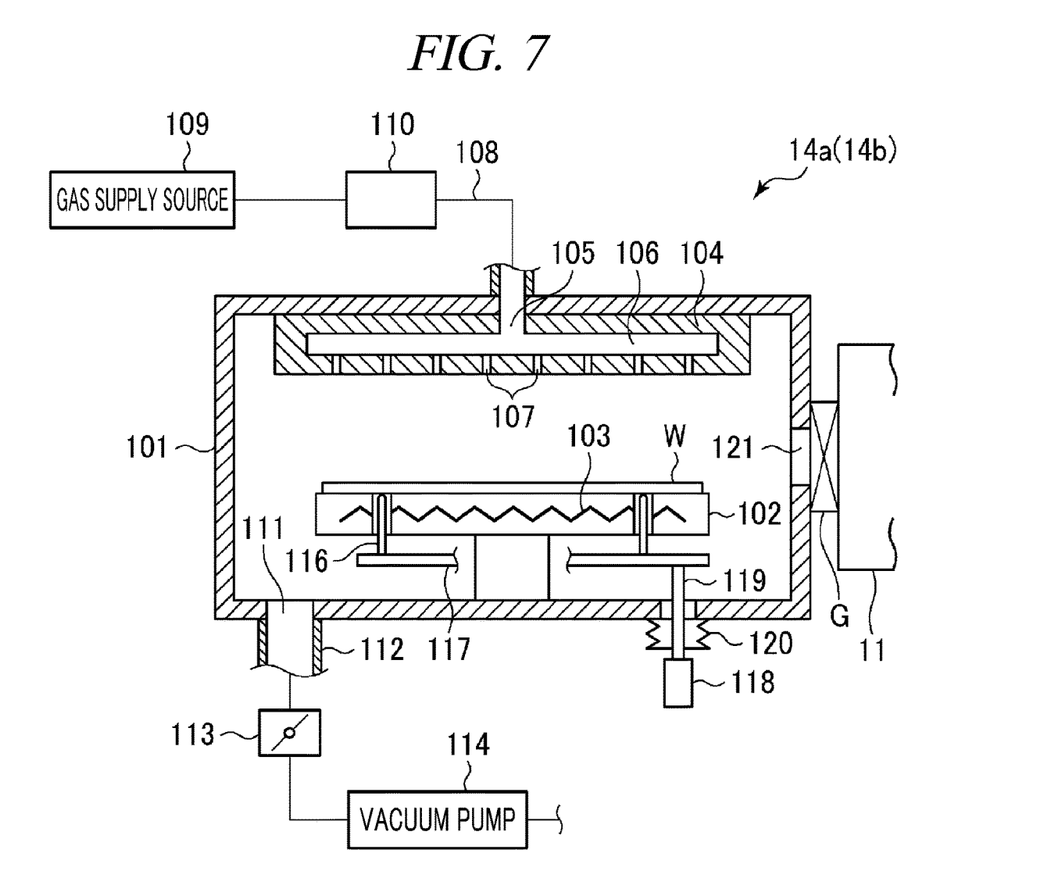
FIG. 7 is a cross sectional view illustrating a liner film forming apparatus provided in the film forming system of FIG. 5 and configured to form a liner film.

Now, the liner film forming apparatus 14a (14b) configured to form a liner film will be explained. The liner film can be appropriately formed by thermal CVD. FIG. 7 is a cross sectional view illustrating an example of the liner film forming apparatus. This liner film forming apparatus forms a Ru film as a liner film by thermal CVD.

As depicted in FIG. 7, the liner film forming apparatus 14a (14b) has a cylindrical processing vessel 101 made of, by way of example, but not limitation, aluminum. A mounting table 102 configured to mount a wafer W thereon and made of ceramic such as, but not limited to, AlN is placed within the processing vessel 101, and this mounting table 102 has a heater 103 therein. The heater 103 generates heat as power is applied thereto from a heater power supply (not shown).

A shower head 104 configured to introduce a processing gas, into the processing vessel 101, for forming the Ru film, a purge gas, or the like in a shower shape is provided at a ceiling portion of the processing vessel 101, facing the mounting table 102. The shower head 104 has a gas inlet opening 105 at an upper portion thereof, and a gas diffusion space 106 is formed within the shower head 104. Further, multiple gas discharge holes 107 are formed in a bottom surface of the shower head 104. The gas inlet opening 105 is connected with a gas supply line 108, and the gas supply line 108 is connected to a gas supply source 109 configured to supply the processing gas for forming the Ru film, the purge gas, or the like. The gas supply line 108 is provided with a gas control unit 110 including a gas flow rate controller, a valve, and so forth. As the processing gas for forming the Ru film, ruthenium carbonyl ($Ru_3(CO)_{12}$) may be appropriately utilized, as stated above. This ruthenium carbonyl is capable of forming the Ru film by thermal decomposition.

A gas exhaust opening 111 is provided at a bottom portion of the processing vessel 101, and a gas exhaust line 112 is connected to the gas exhaust opening 111. Further, a throttle valve 113 and a vacuum pump 114 configured to adjust a pressure are connected to the gas exhaust line 112. With this configuration, the processing vessel 101 can be vacuum evacuated.

The mounting table 102 is provided with three (only two are illustrated) wafer supporting pins 116 for transfer of wafers. The wafer supporting pins 116 are configured to be protruded above or retracted below a surface of the mounting table 102. These wafer supporting pins 116 are fixed to a supporting plate 117. By moving a rod 119 up and down by a driving device 118 such as an air cylinder, the wafer supporting pins 116 are moved up and down with the supporting plate 117 therebetween. A reference numeral 120 denotes a bellows. Meanwhile, a wafer carry-in/out opening 121 is formed at a sidewall of the processing vessel 101, and a wafer W is carried between the processing vessel 101 and the first vacuum transfer chamber 11 in the state where a gate valve G is opened.

In the liner film forming apparatus 14a (14b) having the above-described configuration, after the gate valve G is opened, the wafer W is placed on the mounting table 102, and the gate valve G is closed. While regulating an internal pressure of the processing vessel 101 to a preset pressure by evacuating the processing vessel 101 by the vacuum pump 114, a processing gas such as a ruthenium carbonyl ($Ru_3(CO)_{12}$) gas is introduced into the processing vessel 101 from a gas supply source 109 via a gas supply line 108 and a shower head 104 in the state where the wafer W is heated to a predetermined temperature by a heater 103 with the mounting table 102 therebetween. Accordingly, reaction of the processing gas progresses on the wafer W, so that a liner film is formed on a surface of the wafer W.

For the formation of the liner film, besides the ruthenium carbonyl, another film forming material such as a ruthenium pentadienyl compound as described above may be used along with a decomposition gas such as an $O_2$ gas.

Moreover, in case of forming a Co film as the liner film, the Co film can be formed by thermal CVD in the same manner as the Ru film. Further, the liner film may be formed by another film forming method such as PVD without being limited to the CVD.

<Other Applications>

The exemplary embodiments are not limiting and can be modified in various ways. In the above described exemplary embodiments, the semiconductor wafer is described as an example of a processing target substrate. The semiconductor wafer, however, includes a compound semiconductor such as GaAs, SiC or GaN as well as a typical silicon wafer. Furthermore, the processing target substrate is not limited to the semiconductor wafer, and the exemplary embodiments may also be applicable to a ceramic substrate, a glass substrate for use in a FPD (Flat Panel Display) of a liquid crystal display device, or the like.

EXPLANATION OF REFERENCE NUMERALS

1: Film forming system
12a, 12b: Barrier film forming apparatus
14a, 14b: Liner film forming apparatus
22a, 22b: Cu-based film forming apparatus
24a, 24b: Cu-based seed film forming apparatus
201: Lower structure
202: Interlayer insulating film
203: Trench
204: Via
205: Barrier film
206: Liner film
207: Cu-based seed film
208: Cu-based film
209: additional layer
210: Cu wiring
211: Lower wiring
W: Semiconductor wafer (substrate)

We claim:

1. A Cu wiring forming method of forming, on a substrate having on a surface thereof a film provided with a trench of a preset pattern and a via formed at a bottom of the trench, a Cu wiring by burying Cu or Cu alloy in the trench and the via, the Cu wiring forming method comprising:
    forming a barrier film on a surface of the film;
    forming, on a surface of the barrier film, a wetting target layer made of Ru or Co to be wet with the Cu or Cu alloy;
    forming, on a surface of the wetting target layer, a Cu-based seed film made of the Cu or Cu alloy and having a thickness corresponding to an amount for filling only the via by PVD;
    filling the via by heating the substrate on which the Cu-based seed film is already formed and flowing the Cu-based seed film into the via so as to expose surface portions of the wetting target layer excluding the via; and
    forming, on the surface of the substrate on which the via is already filled, a Cu-based film made of the Cu or Cu alloy by PVD under a condition that allows the Cu-based film to be flown on the wetting target layer to bury the Cu-based film in the trench.

2. The Cu wiring forming method of claim 1,
    wherein the wetting target layer is formed to have a thickness of 1 nm to 5 nm.

3. The Cu wiring forming method of claim 1,
    wherein the wetting target layer is formed by CVD.

4. The Cu wiring forming method of claim 1,
    wherein a heating temperature for heating the substrate when flowing the Cu-based seed film into the via is in a range from 200° C. to 400° C.

5. The Cu wiring forming method of claim 1,
    wherein the Cu-based film is formed by performing ionized PVD while heating the substrate at 65° C. to 350° C.

6. The Cu wiring forming method of claim 1,
wherein the heating of the substrate after the forming of the Cu-based seed film and the forming of the Cu-based film are performed in a single apparatus.

7. The Cu wiring forming method of claim 1,
wherein the forming of the Cu-based seed film, the heating of the substrate after the forming of the Cu-based seed film and the forming of the Cu-based film are performed in a single apparatus.

8. A semiconductor device manufacturing method of manufacturing, on a substrate having thereon an interlayer insulating film provided with a trench of a preset pattern and a via connecting a bottom portion of the trench and a lower wiring, a semiconductor device by burying Cu or Cu alloy in the trench and the via to form a Cu wiring, the semiconductor device manufacturing method comprising:
forming a barrier film on a surface of the interlayer insulating film;
forming, on a surface of the barrier film, a wetting target layer made of Ru or Co to be wet with the Cu or Cu alloy;
forming, on a surface of the wetting target layer, a Cu-based seed film made of the Cu or Cu alloy and having a thickness corresponding to an amount for filling only the via by PVD;
filling the via by heating the substrate on which the Cu-based seed film is already formed and flowing the Cu-based seed film into the via so as to expose surface portions of the wetting target layer excluding the via;
forming, on a surface of the substrate on which the via is already filled, a Cu-based film made of the Cu or Cu alloy by PVD under a condition that allows the Cu-based film to be flown on the wetting target layer to bury the Cu-based film in the trench; and
forming the Cu wiring by polishing an entire surface and removing the Cu-based film, the wetting target layer and the barrier film on a surface except the trench.

9. The semiconductor device manufacturing method of claim 8,
wherein the wetting target layer is formed to have a thickness of 1 nm to 5 nm.

10. The semiconductor device manufacturing method of claim 8,
wherein the wetting target layer is formed by CVD.

11. The semiconductor device manufacturing method of claim 8.,
wherein a heating temperature for heating the substrate when flowing the Cu-based seed film into the via is in a range from 200° C. to 400° C.

12. The semiconductor device manufacturing method of claim 8.,
wherein the Cu-based film is formed by performing ionized PVD while heating the substrate at 65° C. to 350° C.

13. The semiconductor device manufacturing method of claim 8.,
wherein the heating of the substrate after the forming of the Cu-based seed film and the forming of the Cu-based film are performed in a single apparatus.

14. The semiconductor device manufacturing method of claim 8,
wherein the forming of the Cu-based seed film, the heating of the substrate after the forming of the Cu-based seed film and the forming of the Cu-based film are performed in a single apparatus.

15. The semiconductor device manufacturing method of claim 8, further comprising:
forming, on the Cu-based film, an additional layer made of the Cu or Cu alloy before polishing the entire surface and after burying the Cu-based film in the trench.

16. A computer-readable recording medium having stored thereon computer-executable instructions that, in response to execution, cause a Cu wiring forming system to perform a Cu wiring forming method of forming, on a substrate having on a surface thereof a film provided with a trench of a preset pattern and a via formed at a bottom of the trench, a Cu wiring by burying Cu or Cu alloy in the trench and the via,
wherein the Cu wiring forming method comprises:
forming a barrier film on a surface of the film;
forming, on a surface of the barrier film, a wetting target layer made of Ru or Co to be wet with the Cu or Cu alloy;
forming, on a surface of the wetting target layer, a Cu-based seed film made of the Cu or Cu alloy and having a thickness corresponding to an amount for filling only the via by PVD;
filling the via by heating the substrate on which the Cu-based seed film is already formed and flowing the Cu-based seed film into the via so as to expose surface portions of the wetting target layer excluding the via; and
forming, on the surface of the substrate on which the via is already filled, a Cu-based film made of the Cu or Cu alloy by PVD under a condition that allows the Cu-based film to be flown on the wetting target layer to bury the Cu-based film in the trench.

* * * * *